US006833872B1

United States Patent
Nakagawa

(10) Patent No.: US 6,833,872 B1
(45) Date of Patent: Dec. 21, 2004

(54) SOLID-STATE IMAGE SENSOR AND METHOD OF DRIVING SAME

(75) Inventor: Shinji Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/467,880

(22) Filed: Dec. 21, 1999

(30) Foreign Application Priority Data

Dec. 25, 1998 (JP) .......................... 10-370842

(51) Int. Cl.[7] .......................... H04N 3/14; H04N 5/335; H01L 27/00; H01L 27/148
(52) U.S. Cl. ...................... 348/311; 348/317; 348/312; 250/208.1; 257/233; 257/231
(58) Field of Search ................. 257/233, 257, 257/258; 348/262, 311, 317, 322, 248, 312; 250/208.1

(56) References Cited

U.S. PATENT DOCUMENTS

| | | |
|---|---|---|
| 4,887,160 A | 12/1989 | Kinoshita et al. |
| 5,051,832 A | 9/1991 | Losee et al. |
| 5,229,857 A | 7/1993 | Taniji |
| 5,235,198 A | 8/1993 | Stevens et al. |
| 5,801,409 A * | 9/1998 | Nam .......................... 257/233 |
| 5,883,667 A * | 3/1999 | Taniji ......................... 348/248 |
| 6,545,713 B1 * | 4/2003 | Watanabe ................... 348/311 |

FOREIGN PATENT DOCUMENTS

| | | |
|---|---|---|
| EP | 0794662 | 9/1997 |
| EP | 0869664 | 10/1998 |
| WO | WO 9739487 | 10/1997 |

* cited by examiner

*Primary Examiner*—Andrew Christensen
*Assistant Examiner*—Gary L Solomon
(74) *Attorney, Agent, or Firm*—Robert J. Depke; Holland & Knight LLP

(57) ABSTRACT

A progressive all-pixel scanning type solid-state image sensor adapted for curtailing the power consumption therein by lowering its read voltage with another advantage of reducing the pixel size. The image sensor comprises pixels arrayed to form a matrix, vertical transfer registers corresponding respectively to individual columns of the pixels, read gates formed correspondingly to the individual pixels for reading out signal charges from the pixels to the vertical transfer registers, and a means for applying phase-shifted read pulses respectively to plural kinds of read gate electrodes in the read gates.

11 Claims, 8 Drawing Sheets

SOLID-STATE IMAGE SENSOR AND METHOD OF DRIVING SAME

RELATED APPLICATION DATA

The present application claims priority to Japanese Application No. P10-370842 filed Dec. 25, 1998, which application is incorporated herein by reference to the extent permitted by law.

BACKGROUND OF THE INVENTION

The present invention relates to a progressive all-pixel scanning type solid-state image sensor and a method of driving such an image sensor.

FIG. 8 shows a known progressive all-pixel scanning type CCD solid-state image sensor based on three-phase driving, particularly the configuration of principal components in its image sensing area.

This CCD solid-state image sensor 1 has a vertical overflow structure, wherein a plurality of light receiving elements 2 each serving as a pixel are arrayed to form a matrix, and a CCD vertical transfer register 3 is formed on one side of each column of the light receiving elements. A read gate 4 for reading a signal charge from the relevant light receiving element 2 to the vertical transfer register 3 is formed between the light receiving element 2 and the vertical transfer register 3, thereby constituting an image sensing area 5. Further, an unshown CCD horizontal transfer register is provided for transferring the signal charge from the vertical transfer register 3 to an output unit. Reference numeral 6 denotes a transfer channel region of the vertical transfer register 3.

The vertical transfer register 3 is so composed that three transfer electrodes 7 ($V_1$, $V_2$, $V_3$) of a three-phase structure correspond to each light receiving element 2. More specifically, for example, a first transfer electrode $V_1$, composed of a first polysilicon layer, a second transfer electrode $V_2$ of a second polysilicon layer and a third transfer electrode $V_3$ of a third polysilicon layer are arrayed in succession repeatedly in the charge transfer direction on the transfer channel region 6 via a gate insulation film.

In the read gate 4, for example, the extension of the second transfer electrode $V_2$ out of the transfer electrodes 7 ($V_1$, $V_2$, $V_3$) is used as a read gate electrode 82, or the extensions of the second and third transfer electrodes $V_2$ and $V_3$ are used as read gate electrodes 82 and 83 respectively.

In this CCD solid state image sensor 1, three-phase vertical driving pulses $\phi V_1$, $\phi V_2$, $\phi V_3$ are applied to the first transfer electrode $V_1$, second transfer electrode $V_2$ and third transfer electrode $V_3$ respectively, and a read pulse $\phi_{SG}$ (not shown) is superposed on a required one of such vertical driving pulses $\phi V_1 - \phi V_3$. And in progressive scanning to read all pixels sequentially, the signal charges of the entire light receiving elements 2 are read out therefrom simultaneously. For example, there is adopted a mode of applying a read pulse $\phi_{SG}$ only to the second transfer electrode $V_2$ and reading out the signal charge from the read gate 4, or a mode of applying a read pulse to the second and third transfer electrodes $V_2$ and $V_3$, and reading out the signal charge from the read gate 4 thus widened in frontage. Thereafter the signal charges are transferred vertically by vertical driving pulses $\phi V_1 - \phi V_3$.

In the known progressive all-pixel scanning type CCD solid-state image sensor 1 where the signal charges of the entire light receiving elements 2 are read simultaneously to the vertical transfer registers 3, there exists a problem that, when a read pulse $\phi_{SG}$, is applied, the potential in the overflow barrier of the light receiving element 2 tends to become deep, and it is difficult to lower the voltage of the read pulse $\phi_{SG}$ (hereinafter referred to as read voltage) required for transferring the signal charge from the light receiving element 2 to the vertical transfer register 3.

Further, due to such a phenomenon that the overflow barrier is deepened by application of the read pulse $\phi_{SG}$, it has been impossible heretofore to achieve a remarkable improvement in lowering the read voltage by merely increasing the region for application of the read pulse $\phi_{SG}$, i.e., the frontage from the light receiving element 2 to the vertical transfer register 3, namely the frontage (width) of the read gate 4.

In the configuration of FIG. 8 for example, when a read pulse $\phi_{SG}$ is applied to the second and third transfer electrodes $V_2$ and $V_3$ to read out the signal charge from the widened frontage of the read gate 4 composed of the read gate electrodes 82 and 83, then a higher voltage is applied to ⅔ of the entire pixel area, so that the overflow barrier of the light receiving elements 2 is also deepened to eventually bring about another problem that the read voltage is rendered higher.

In order to suppress this undesired phenomenon, if reading is executed only from the read electrode 82 alone by applying the read pulse $\phi_{SG}$ merely to the second transfer electrode $V_2$, then the frontage of the read gate 4 is narrowed on the contrary to impede the signal charge flow, hence raising the read voltage as a result.

In addition, lowering the read voltage is rendered further difficult due to the recent rapid progress in diminishing the chip size and increasing the number of component pixels. Such a rise of the read voltage naturally causes a greater power consumption inclusive of a peripheral system.

SUMMARY OF THE INVENTION

It is therefore an object of the present invention to provide a progressive all-pixel scanning type solid-state image sensor which is adapted for curtailing the power consumption by lowering a read voltage with another advantage of reducing the pixel size.

And another object of the present invention resides in providing an improved method of driving such a solid-state image sensor.

According to one aspect of the present invention, there is provided a progressive scanning type solid-state image sensor for reading all pixels sequentially. The image sensor comprises pixels arrayed to form a matrix; vertical transfer registers corresponding respectively to individual columns of the pixels; read gates formed correspondingly to the individual pixels for reading out signal charges from the pixels to the vertical transfer registers; and a means for applying phase-shifted read pulses respectively to plural kinds of read gate electrodes in the read gates.

And according to another aspect of the present invention, there is provided a method of driving a progressive scanning type solid-state image sensor to read all pixels sequentially by applying phase-shifted read pulses respectively to plural kinds of read gate electrodes in read gates which are formed correspondingly to the individual pixels and are disposed between the arrayed pixels and charge transfer registers provided correspondingly to the individual columns of the pixels.

Thus, in progressive scanning to read the entire pixels sequentially, read pulses of shifted phases are applied to plural kinds of read gate electrodes in the read gates corresponding respectively to the individual pixels, and/or the read pulses of shifted phases are applied respectively to the read gates for a plurality of pixel groups.

In this manner, due to application of the phase-shifted read pulses to the plural kinds of read gate electrodes in the individual read gates and/or to the read gates respectively for a plurality of pixel groups, the pixel region where the read pulses are applied simultaneously in the entire pixel area is diminished to be smaller than the region in the related art, hence suppressing the modulation to the overflow barrier. Further, since the frontage of the read gate can be widened, it becomes possible to lower the read pulse voltage.

The above and other features and advantages of the present invention will become apparent from the following description which will be given with reference to the illustrative accompanying drawings.

DETAILED DESCRIPTION OF THE PREFERRED EMBODIMENTS

Hereinafter some preferred embodiments of the present invention will be described in detail with reference to the accompanying drawings.

Figure 1:
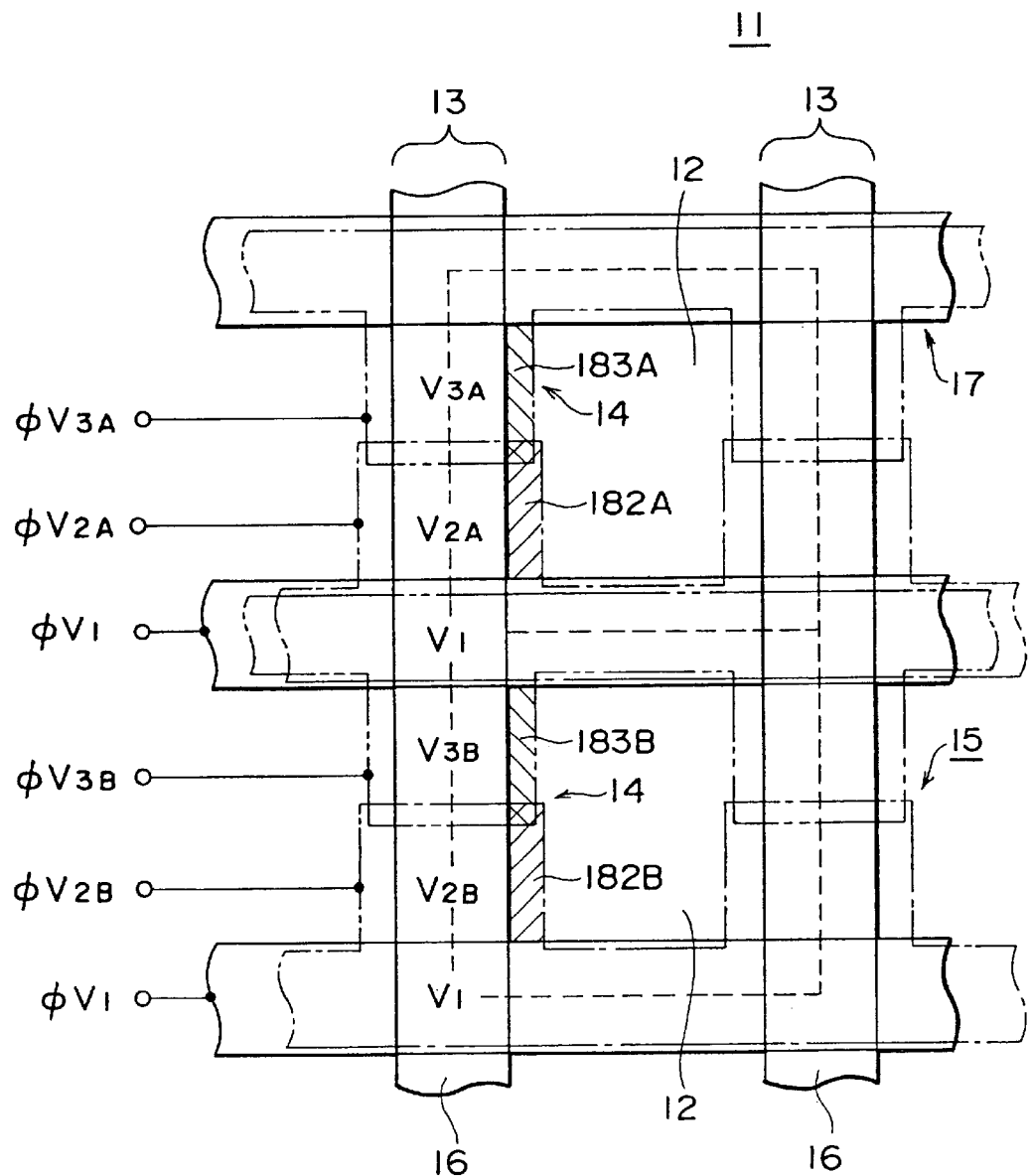
FIG. 1 shows a configuration of principal components in an embodiment representing the solid-state image sensor of the present invention.

FIG. 1 shows an embodiment which represents the progressive all-pixel scanning type solid-state image sensor of the present invention. This embodiment corresponds to an exemplary case of applying the invention to a three-phase driven CCD solid-state image sensor of a progressive scanning type that reads all pixels in sequence, and FIG. 1 shows the configuration of principal components in its image sensing area.

The CCD solid-state image sensor 11 in this embodiment has a vertical overflow structure, wherein a plurality of light receiving elements 12 serving as pixels are arrayed to form a matrix. A CCD vertical transfer register 13 is provided on one side of each column of the light receiving elements 12, and read gates 14 for reading the signal charges from the light receiving elements 12 to the vertical transfer register 13 are formed between the light receiving elements 12 and the vertical transfer register 13 to thereby constitute an image sensing area 15. Further, an unshown CCD horizontal transfer register is also provided for transferring the signal charges from the vertical transfer register 13 to an output unit. Reference numeral 16 denotes a transfer channel region of the vertical transfer register 13.

In the vertical transfer register 13, three transfer electrodes 17 ($V_1$, $V_2$, $V_3$) of a three-layer structure are disposed opposite to each light receiving element 12, wherein the second and third transfer electrodes corresponding to each odd-line light receiving element 12 are structurally separated from the second and third transfer electrodes corresponding to each even-line light receiving element 12.

More specifically, in this embodiment, a first transfer electrode $V_1$ composed of a first polysilicon layer, a second transfer electrode $V_{2A}$ composed of a second polysilicon layer, and a third transfer electrode $V_{3A}$ composed of a third polysilicon layer, are arrayed on the transfer channel region 16 via a gate insulation film correspondingly to, e.g., each odd-line light receiving element 12. Meanwhile, a first transfer electrode $V_1$ composed of a first polysilicon layer, a second transfer electrode $V_{2B}$ composed of a second polysilicon layer, and a third transfer electrode $V_{3B}$ composed of a third polysilicon layer, are arrayed on the transfer channel region 16 via a gate insulation film correspondingly to, e.g., each even-line light receiving element 12. These transfer electrodes $V_1$, $V_{2A}$, $V_{3A}$, $V_1$, $V_{2B}$ and $V_{3B}$, are arrayed in sequence repeatedly in the charge transfer direction.

The read gate 14 is so formed as to have plural (two in this embodiment) kinds of read gate electrodes. In FIG. 1, extensions of the second transfer electrode $V_{2A}$ and the third transfer electrodes $V_{3A}$ serve as two kinds of gate electrodes 182A and 183A of an odd-line read gate 14, and the extensions of the second transfer electrode $V_{2B}$ and the third transfer electrode $V_{3B}$ serve as two kinds of read gate electrodes 182B and 183B of an even-line read gate 14.

Figure 2:
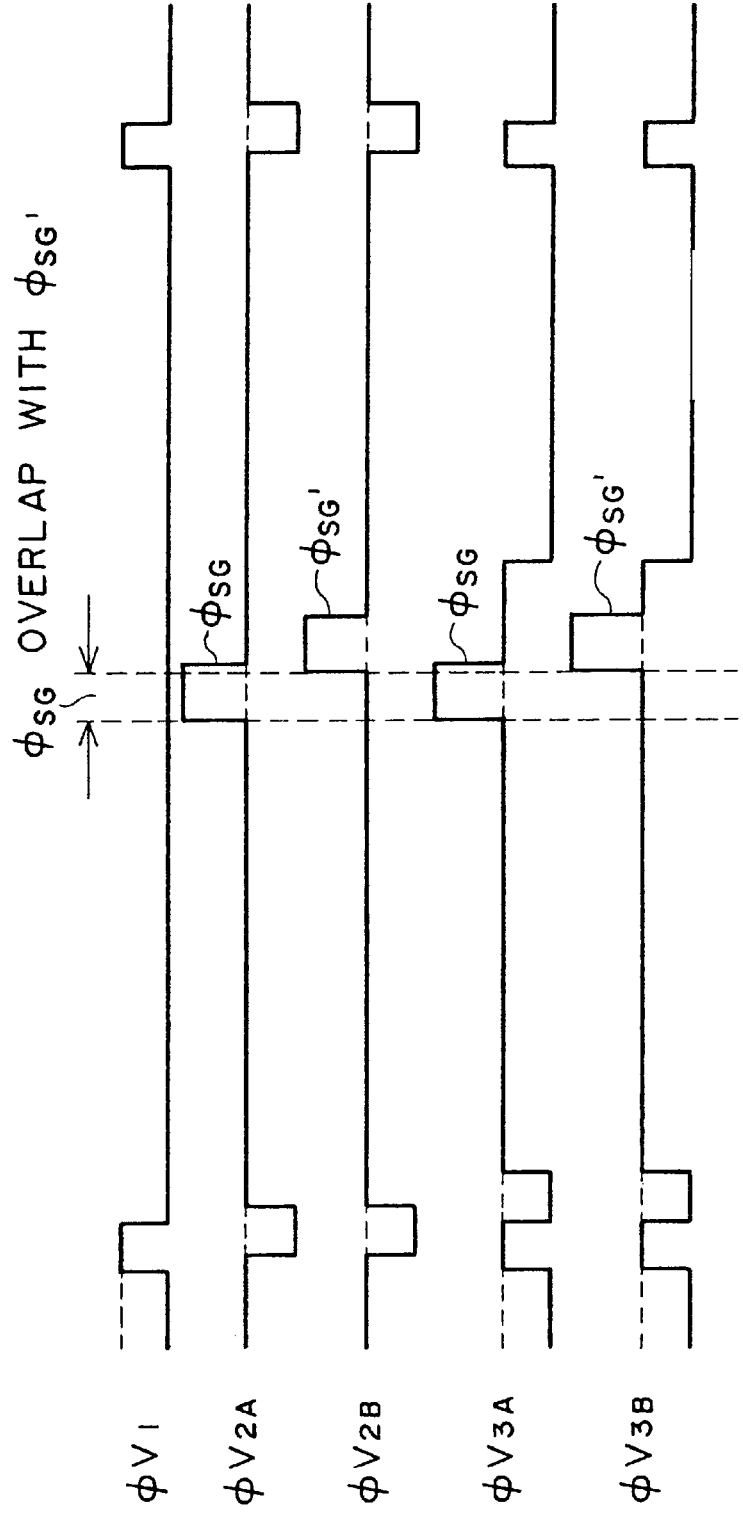
FIG. 2 is a timing chart of vertical driving pulses in the embodiment of the present invention.

In this CCD solid-state image sensor, vertical driving pulses $\phi V_1$, $\phi V_{2A}$, $\phi V_{3A}$, $\phi V_{2B}$ and $\phi V_{3B}$ shown in FIG. 2 for example are applied respectively to the transfer electrodes $V_1$, $V_{2A}$, $V_{3A}$, $V_{2B}$ and $V_{3B}$ of the vertical transfer register 13. Each of the driving pulses $\phi V_{2A}$ and $\phi V_{3A}$ applied to the odd-line second and third transfer electrodes $V_{2A}$ and $V_{3A}$ is a ternary pulse (e.g., −7V, 0V, +15V) where a read pulse $\phi_{SG}$ is superposed. Similarly, each of the driving pulses $\phi V_{2B}$ and $\phi V_{3B}$ applied to the even-line second and third transfer electrodes $V_{2B}$ and $V_{3B}$ is a ternary pulse (e.g., −7V, 0V, +15V) where a read pulse $\phi_{SG}'$ is superposed.

In the vertical driving pulses mentioned above, clock pulses $\phi V_{2A}$ and $\phi V_{2B}$, and also $\phi V_{3A}$ and $\phi V_{3B}$ for normal vertical transfer mutually have an in-phase relation, while read pulses $\phi_{SG}$ and $\phi_{SG}'$ mutually have a timing shift in the leading edges thereof. In the example of FIG. 2, the read pulses $\phi_{SG}$ for $\phi V_{2A}$ and $\phi V_{3A}$ have an in-phase relation, and the read pulses $\phi_{SG}'$ for $\phi V_{2B}$ and $\phi V_{3B}$ have an in-phase relation.

In the CCD solid-state image sensor 11 of this embodiment, read pulses $\phi_{SG}$ are applied, in progressive scanning to read all pixels, simultaneously to the second and third transfer electrodes $V_{2A}$ and $V_{3A}$ on one side, hence to the read gate electrodes 182A and 183A, so that the signal charges of the odd-line light receiving elements 12 are first read out below the second and third transfer electrodes $V_{2A}$ and $V_{3A}$ of the vertical transfer register 13. Thereafter with a slight lag, read pulses $\phi_{SG}'$ are applied simultaneously to the second and third transfer electrodes $V_{2B}$ and $V_{3B}$ on the other side, hence to the read gate electrodes 182B and 183B, so that the signal charges of the even-line light receiving elements 12 are read out below the second and third transfer electrodes $V_{2B}$ and $V_{3B}$ of the vertical transfer register 13, whereby the entire pixels are read out in sequence. Subsequently, the signal charges are transferred vertically by the vertical driving pulses $\phi V_1$, $\phi V_{2A}$, $\phi V_{2B}$, $\phi V_{3A}$ and $\phi V_{3B}$.

According to the embodiment mentioned above, the read gate electrodes 182A and 183A of the odd-line read gate 14 are separated respectively from the read gate electrodes 182B and 183B of the even-line read gate 14, and in progressive scanning to read all pixels, the phase of the read pulses $\phi_{SG}$ applied to the odd-line read gate electrodes 182A and 183A is shifted from the phase of the read pulses $\phi_{SG}'$ applied to the even-line read gate electrodes 182B and 183B. Therefore, even when the read pulses $\phi_{SG}$ and $\phi_{SG}'$ are applied respectively to the two transfer electrodes $V_{2A}$, $V_{3A}$ and transfer electrodes $V_{2B}$, $V_{3B}$, the region where the read pulses $\phi_{SG}$ or $\phi_{SG}'$ are applied is merely ⅓ of the entire pixel area, so that it becomes possible to diminish the modulation to the overflow barrier in comparison with the known value in the conventional progressive all-pixel scanning type CCD solid-state image sensor 1 described.

Further, since the frontage of the read gate 14 can be widened equivalently to two electrodes (182A and 183A, or 182B and 183B), the read voltage of the read pulses $\phi_{SG}$ and $\phi_{SG}'$ is suppressible to a lower value with reduction of the modulation to the overflow barrier. Consequently, it becomes possible to curtail the power consumption in the progressive all-pixel scanning type CCD solid-state image sensor inclusive of the peripheral system. Moreover, the pixel size is also reducible due to the advantage of lowering the read voltage by thus widening the frontage of the read gate 14.

Figure 3:
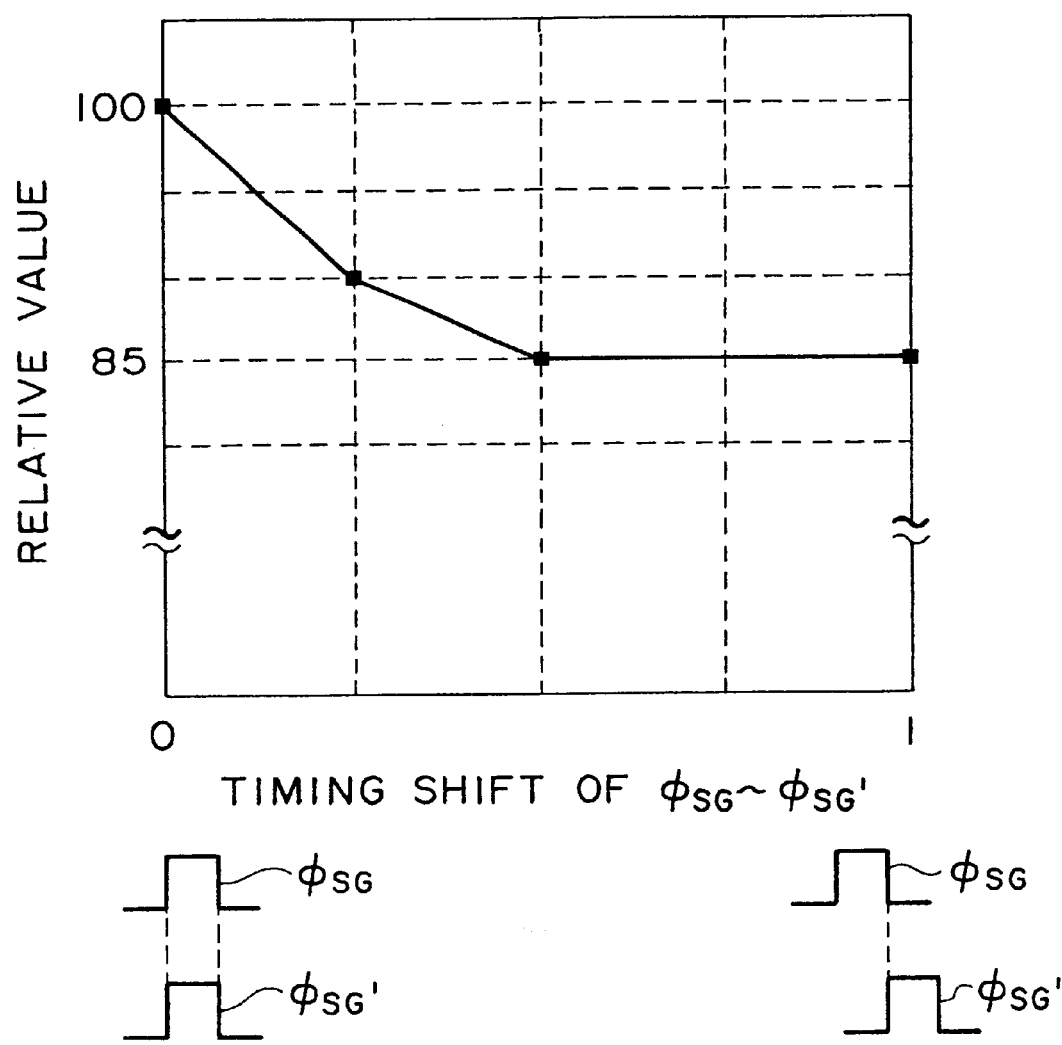
FIG. 3 graphically shows some read voltage changes caused due to timing shifts of read pulses.

FIG. 3 graphically shows the results of actually measuring and evaluating the read voltage changes caused by the rise time difference (timing shift) between the read pulses $\phi_{SG}$ and $\phi_{SG}'$ applied respectively to the odd-line second and third transfer electrodes $V_{2A}$, $V_{3A}$ and the even-line second and third transfer electrodes $V_{2B}$, $V_{3B}$.

In FIG. 3 where the timing shift between the read pulses $\phi_{SG}$ and $\phi_{SG}'$ is taken along the abscissa, the shift is denoted as "0", when the two read pulses $\phi_{SG}$ and $\phi_{SG}'$ mutually have an in-phase relation, and the shift is denoted as "1" when these read pulses $\phi_{SG}$ and $\phi_{SG}'$ have a shift equivalent exactly to the pulse duration. In this graph, the read voltage (i.e., voltage value of the read pulse) is taken along the ordinate, and each numerical value is expressed by an absolute one.

According to FIG. 3, there is observed that the read voltage is widely lowered by slightly changing the rise times of the read pulses $\phi_{SG}$ and $\phi_{SG}'$. Although different depending on the size of the CCD solid-state image sensor, after the timing shift (i.e., the difference obtained by subtracting the overlap of $\phi_{SG}'$ from the pulse duration of $\phi_{SG}$ in FIG. 2) exceeds approximately ½ of the pulse duration, the read voltage is kept substantially constant without being lowered any further.

In this embodiment where the shift between the read pulses $\phi_{SG}$ and $\phi_{SG}'$ is an extremely short time, the exposure time difference caused in the odd-line and even-line light receiving elements 12 by such timing shift is negligible to consequently bring about no problem. The point that such exposure time difference is negligible conforms to any of other undermentioned embodiments as well.

Figure 4:
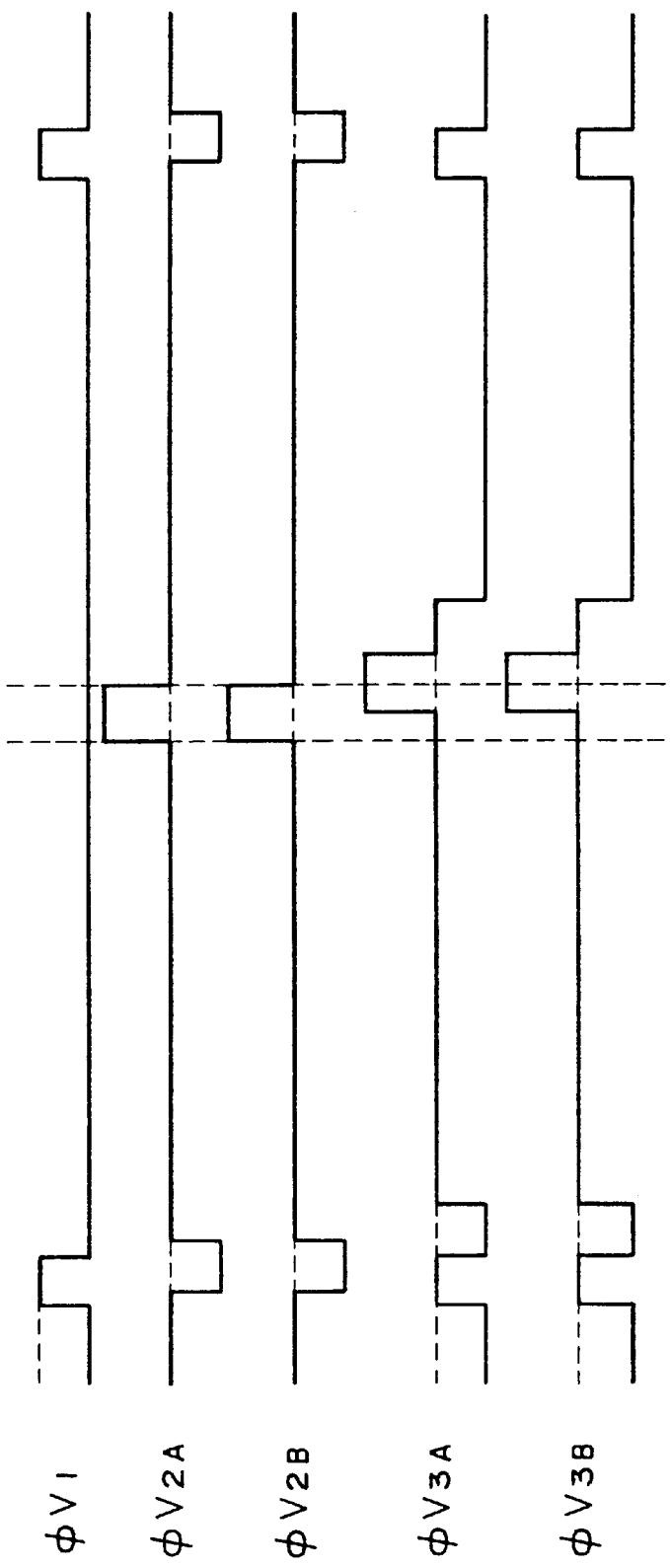
FIG. 4 is a timing chart of vertical driving pulses in another embodiment of the invention.

FIG. 4 shows another embodiment representing the progressive all-pixel scanning type CCD solid-state image sensor of the present invention, particularly with another timing example of reading from light receiving elements to vertical transfer registers.

This embodiment is so contrived that, in progressive scanning to read all pixels sequentially in the aforementioned configuration of the foregoing CCD solid-state image sensor 11 in FIG. 1, phase-shifted read pulses $\phi_{SG}$ and $\phi_{SG}'$ are applied to the read gates for the individual light receiving elements 12, i.e., to the two kinds of read gates 182A, 182B and 183A, 183B in the read gates 14 for the same pixels.

In this embodiment, in-phase read pulses $\phi_{SG}$ are applied to the respective second transfer electrodes $V_{2A}$ and $V_{2B}$ of odd-lines and even-lines, while in-phase read pulses $\phi_{SG}'$ are applied to the respective third transfer electrodes $V_{3A}$ and $V_{3B}$ of odd-lines and even-lines.

In the vertical driving pulses mentioned, clock pulses $\phi V_1$, $\phi V_{2A}$, $\phi V_{2B}$, $\phi V_{3A}$ and $\phi V_{3B}$ for normal vertical transfer are the same as those in FIG. 2.

According to the embodiment of FIG. 4, phase-shifted read pulses $\phi_{SG}$ and $\phi_{SG}'$ are applied, in progressive all-pixel scanning, to the two kinds of read gate electrodes 182A and 183A, 182B and 183B in the individual read gates 14, so that the region where the read pulses are applied simultaneously is reduced to ⅓ of the entire pixel area as in the foregoing case of FIG. 2. Therefore, the modulation to the overflow barrier can be diminished in comparison with the known value, and the frontage of the read gate 14 can be widened equivalently to two electrodes (182A and 183A, or 182B and 183B), hence lowering the read voltage.

Consequently, it becomes possible to curtail the power consumption in the progressive all-pixel scanning type CCD solid-state image sensor inclusive of the peripheral system, with another advantage of reducing the pixel size.

Figure 5:
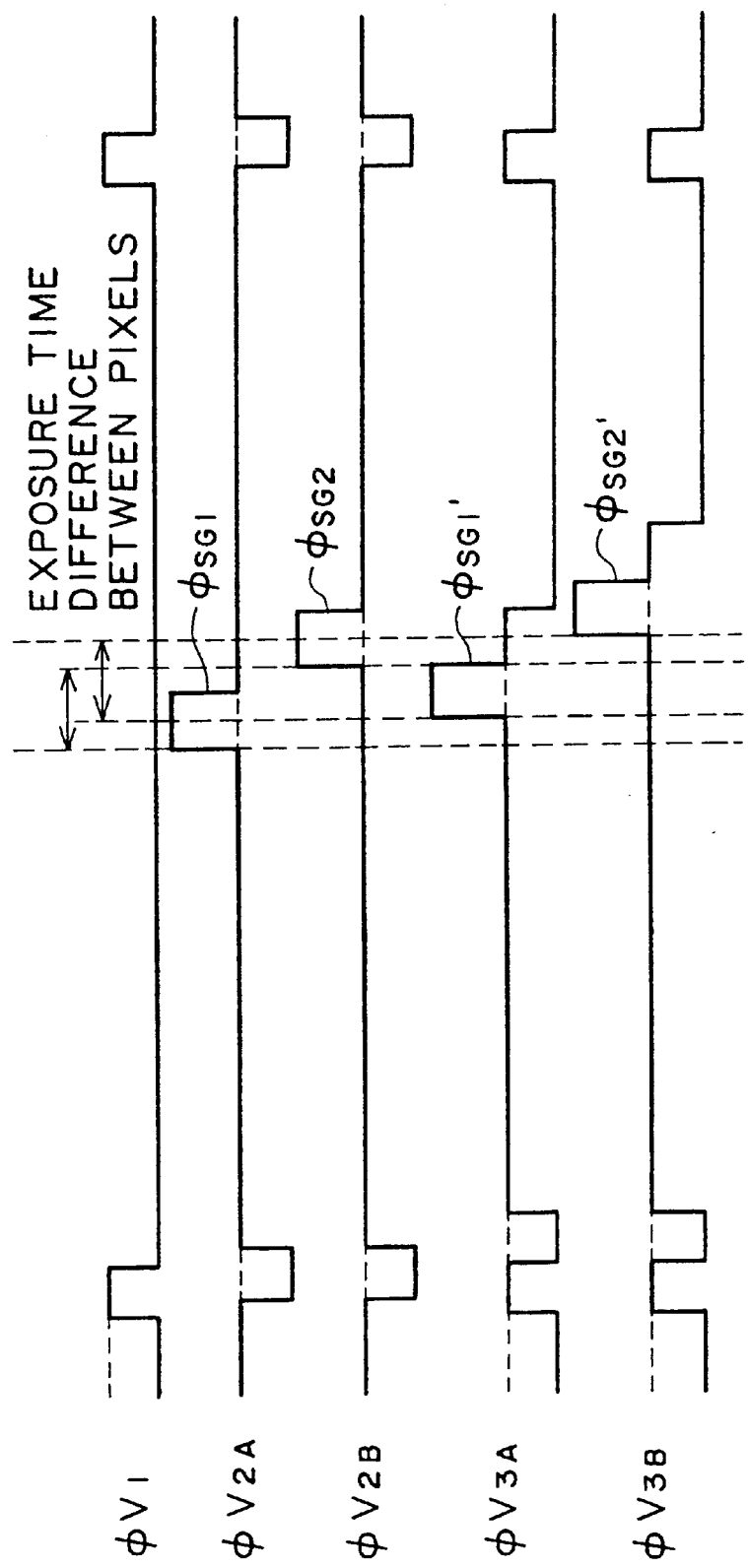
FIG. 5 is a timing chart of vertical driving pulses in a further embodiment of the invention.

FIG. 5 shows a further embodiment representing the progressive all-pixel scanning type CCD solid-state image sensor of the present invention, particularly with a further timing example of reading from light receiving elements to vertical transfer registers.

This embodiment is based on a combination of the read timing in FIGS. 2 and 4. In progressive scanning to read all pixels sequentially in the CCD solid-state image sensor of FIG. 1, read pulses ($\phi_{SG1}$, $\phi_{SG2}$) and ($\phi_{SG1}'$, $\phi_{SG2}'$) applied to the odd-line read gate 14 and the even-line read gate 14 are phase-shifted, and simultaneously the read pulses $\phi_{SG1}$ and $\phi_{SG2}$ applied to two kinds of read gate electrodes 182A and 183A in the odd-line read gate 14 are also phase-shifted, and further the read pulses $\phi_{SG1}'$ and $\phi_{SG2}'$ applied to two kinds of read gate electrodes 182B and 183B in the even-line read gate 14 are phase-shifted. In the driving pulses mentioned, clock pulses $\phi V_1$, $\phi V_{2A}$, $\phi V_{2B}$, $\phi V_{3A}$ and $\phi V_{3B}$ for vertical transfer are the same in timing as those shown in FIG. 2.

According to this embodiment, in progressive scanning to read all pixels sequentially, the read pulses ($\phi_{SG1}$, $\phi_{SG2}$) and ($\phi_{SG1}'$, $\phi_{SG2}'$) applied respectively to the odd-line and even-line read gates 14 are phase-shifted, and also the read pulses $\phi_{SG1}$ and $\phi_{SG2}$, $\phi_{SG1}'$ and $\phi_{SG2}'$ applied respectively to the two kinds of electrodes 182A and 183A, 182B and 183B in the same read gate 14 are phase-shifted, so that the region where the read pulses are applied simultaneously is diminished in comparison with the entire pixel area, and the read voltage is further lowered to eventually curtail the power consumption. In addition, it becomes possible to attain a dimensional reduction with regard to the pixel size.

Meanwhile, the transfer electrodes of each vertical transfer register need not exactly be formed into the particular structure shown in FIG. 1, and it is similarly possible to lower the read voltage, even in an ordinary three-phase driven transfer electrode structure, by shifting the phases of read pulses applied to two kinds of read gate electrodes in each read gate.

Figure 6:
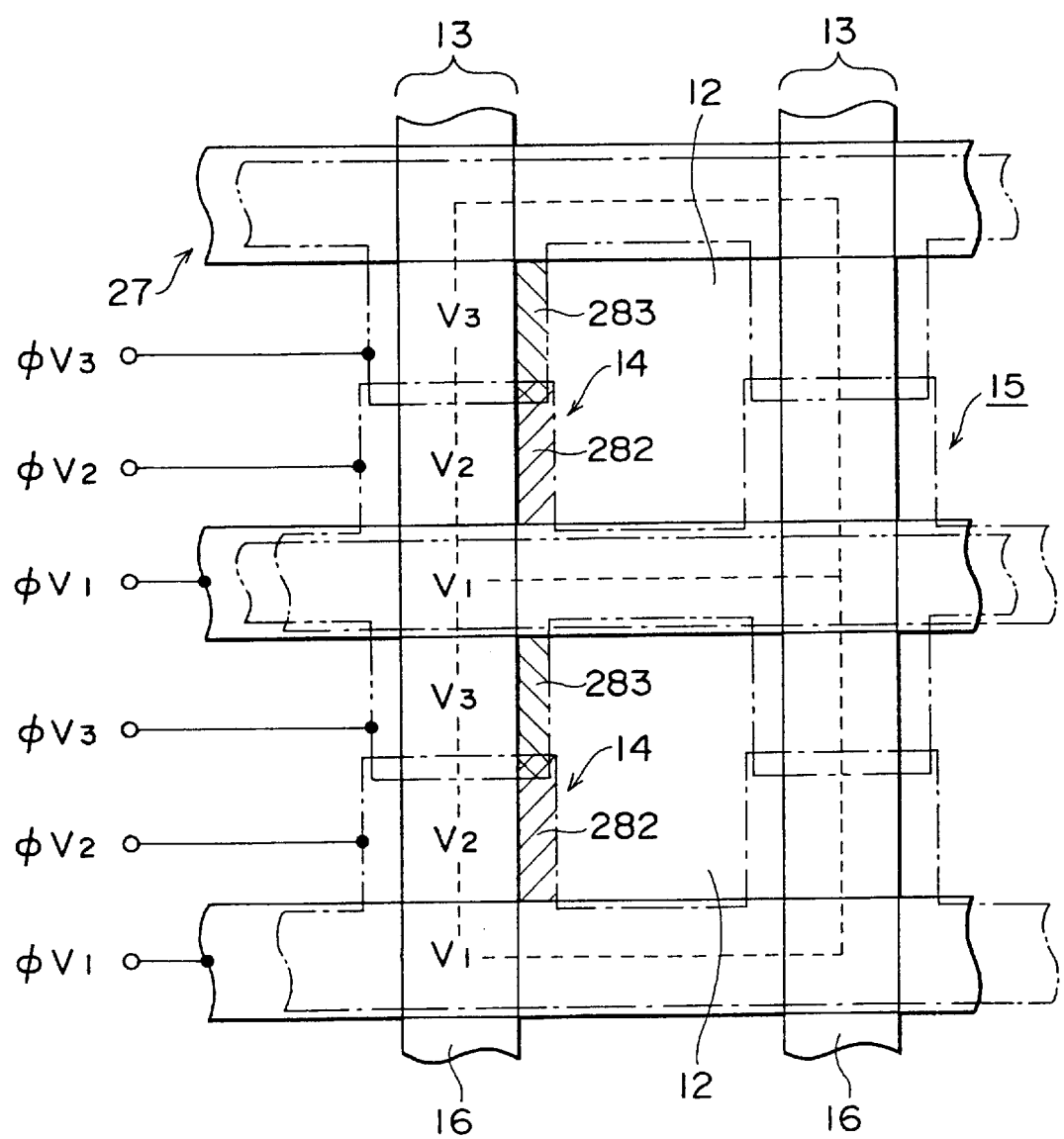
FIG. 6 shows a configuration of principal components in another embodiment representing the solid-state image sensor of the invention.
Figure 7:
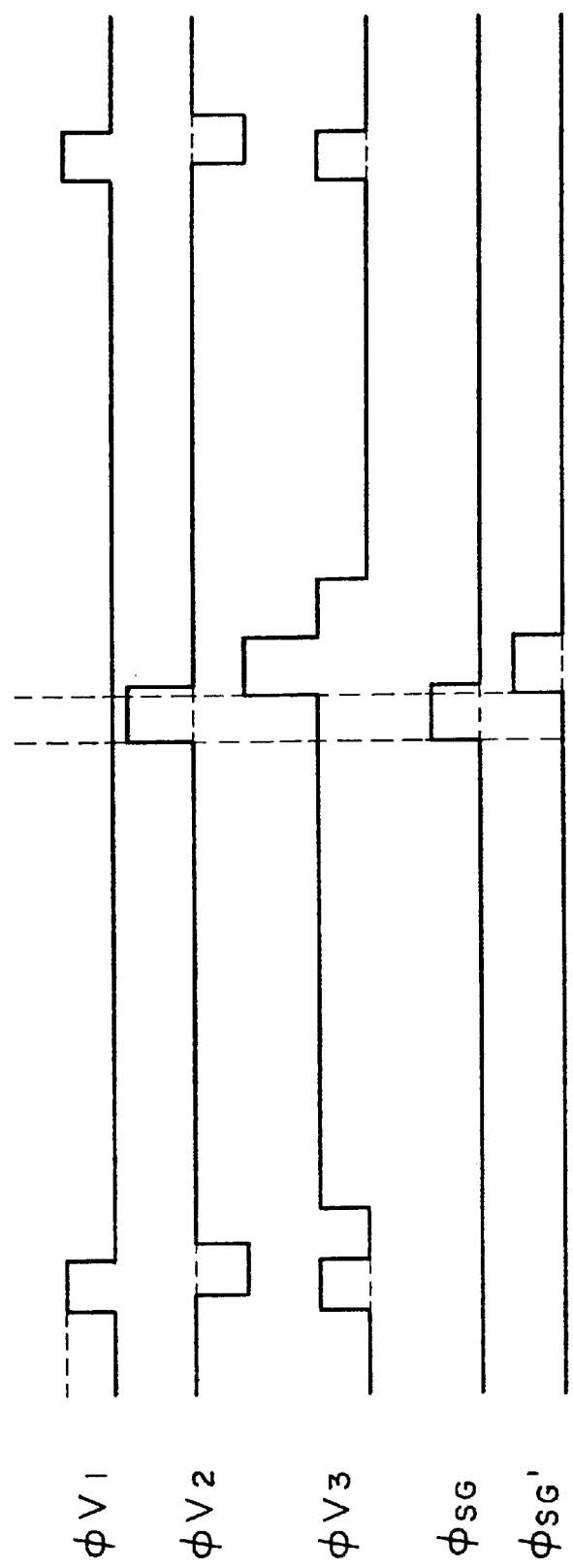
FIG. 7 is a timing chart of vertical driving pulses in FIG. 6.

FIGS. 6 and 7 show a further preferred embodiment representing the progressive all-pixel scanning type CCD solid-state sensor of the present invention that meets the above requirement.

The CCD solid-state image sensor 21 in this embodiment has a vertical overflow structure, wherein a plurality of light receiving elements 12 serving as pixels are arrayed to form a matrix. A CCD vertical transfer register 13 is provided on one side of each column of the light receiving elements 12, and read gates 14 for reading the signal charges from the light receiving elements 12 to the vertical transfer register 13 are formed between the light receiving elements 12 and the vertical transfer register 13 to thereby constitute an image sensing area. Further, an unshown CCD horizontal transfer register is also provided for transferring the signal charges from the vertical transfer register 13 to an output unit. Reference numeral 16 denotes a transfer channel region of the vertical transfer register.

Figure 8:
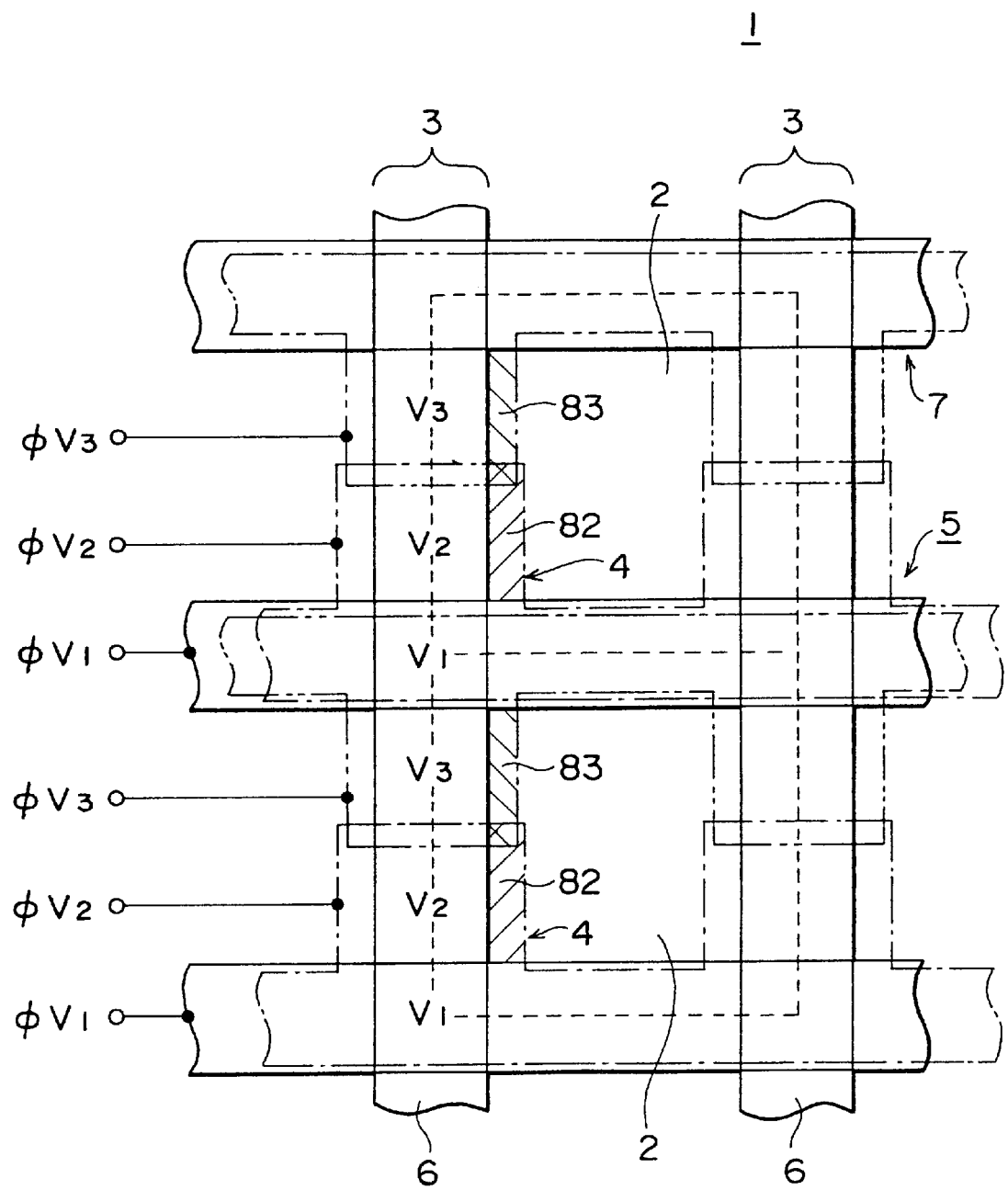
FIG. 8 shows a configuration of principal components in a solid-state image sensor according to the related art.

In the vertical transfer register 13, three transfer electrodes 27 ($V_1$, $V_2$, $V_3$) of a three-layer structure are disposed opposite to each light receiving element 12, as in the aforementioned example of FIG. 8. More specifically, a first transfer electrode $V_1$ composed of a first polysilicon layer, a second transfer electrode $V_2$ composed of a second polysilicon layer, and a third transfer electrode $V_3$ composed of a third polysilicon layer, are arrayed on the transfer channel region 16 via a gate insulation film successively and repeatedly in the charge transfer direction.

In this embodiment, extensions of, for example, the second transfer electrode $V_2$ and the third transfer electrode $V_3$ out of the entire transfer electrodes 27 serve as read gate electrodes 282 and 283 of each read gate 14.

In this CCD solid-state image sensor 21, vertical driving pulses $\phi V_1$, $\phi V_2$ and $\phi V_3$ shown in FIG. 7 are applied to the transfer electrodes 27 ($V_1$, $V_2$, $V_3$) of the vertical transfer register 13. The driving pulses $\phi V_2$ and $\phi_3$ are ternary ones where read pulses $\phi_{SG}$ and $\phi_{SG}'$ are superposed respectively. Such read pulses $\phi_{SG}$ and $\phi_{SG}'$ are mutually shifted in rise timing.

Therefore, in progressive scanning to read all pixels sequentially, first a read pulse $\phi_{SG}$ is applied to the read gate electrode 282 via the transfer electrode $V_2$, then a read pulse $\phi_{SG}'$ is applied to the read gate electrode 283 via the transfer electrode $V_3$, and the read pulse $\phi_{SG}$ to the transfer electrode $V_2$ is caused to fall in a state where the read pulse $\phi_{SG}$ is still being applied to the transfer electrode $V_3$. That is, the signal charge in the light receiving element 12 is first read out below the transfer electrode $V_2$ via the read gate electrode 282, and slightly later the remaining signal charge is read out below the transfer electrode $V_3$ via the read gate electrode 283, whereby the progressive scanning is executed.

According to this embodiment, two read gate electrodes 282 and 283 are provided for each light receiving element 12 in an ordinary electrode array, and read pulses $\phi_{SG}$ and $\phi_{SG}'$ are applied thereto respectively at the timings shown in FIG. 7, so that it becomes possible, as in the aforementioned embodiment, to prevent the problem of deepening the overflow barrier with an advantageous effect of shallowing the potential of the light receiving element 12 to consequently lower the read voltage.

Therefore, the power consumption can be curtailed in the progressive all-pixel scanning type CCD solid-state image sensor inclusive of the peripheral system, and further a dimensional reduction of the pixel size is realizable as well.

The embodiment described above represents an exemplary case of applying the present invention to a three-phase driven progressive scanning type CCD solid-state image sensor. However, it is also possible to apply the invention to a four-phase driven progressive scanning type CCD solid-state image sensor. In a four-phase driven type, read gate electrodes may be formed of extensions of transfer electrodes corresponding to two phases (i.e., a read gate with two kinds of read gate electrodes), or read gate electrodes may be formed of extensions of transfer electrodes corresponding to three phases (i.e., a read gate with three kinds of read gate electrodes). In the case of three kinds of read gate electrodes employing the progressive all-pixel scanning of FIG. 4, read pulses applied to three kinds of read gate electrodes are phase-shifted little by little to one another.

In the embodiments of FIGS. 2 and 5, phase-shifted read pulses $\phi_{SG}$ and $\phi_{SG}'$ are applied respectively to odd-line groups of pixels (light receiving elements) and even-line groups of pixels (light receiving elements). Besides the above, it is also possible to apply phase-shifted read pulses respectively to read gates for any plural pixel groups.

Thus, according to the progressive all-pixel scanning type solid-state image sensor of the present invention, plural kinds of read gate electrodes are provided in each of read gates corresponding to individual pixels, and a means is provided for applying phase-shifted read pulses respectively to such read gate electrodes, so that the regions where the read pulses are applied simultaneously can be diminished in comparison with the entire pixel area, hence attaining advantages of lowering the read voltage and curtailing the power consumption with another merit of dimensionally reducing the pixel size.

Also according to the progressive all-pixel scanning type solid-state image sensor of the present invention, a means is provided for applying phase-shifted read pulses respectively to the read gates for a plurality of pixel groups. Therefore, the regions where the read pulses are applied simultaneously can be diminished in comparison with the entire pixel area to consequently lower the read voltage and curtail the power consumption with another advantage of dimensionally reducing the pixel size.

Further according to the progressive all-pixel scanning type solid-state image sensor of the present invention, plural kinds of read gate electrodes are provided in each of read gates corresponding to individual pixels, and a means is provided for applying phase-shifted read pulses respectively to such read gate electrodes, and also applying the phase-shifted read pulses respectively to the read gates for a plurality of pixel groups. In this configuration, the regions where the read pulses are applied simultaneously can be more diminished in comparison with the entire pixel area, hence attaining advantages of further curtailing the power consumption and reducing the pixel size.

According to the method of driving the progressive all-pixel scanning type solid-state image sensor of the present invention, phase-shifted read pulses are applied to plural kinds of read gate electrodes in each of read gates corresponding to individual pixels, thereby lowering the read voltage to curtail the power consumption. And thus, it becomes possible to realize low-power driving in the solid-state image sensor having down-sized pixels.

Also according to the method of driving the progressive all-pixel scanning type solid-state image sensor of the present invention, phase-shifted read pulses are applied respectively to a plurality of pixel groups to consequently lower the read voltage, thereby curtailing the power consumption with another advantage that realizes lower-power driving in the solid-state image sensor having down-sized pixels.

Further according to the method of driving the progressive all-pixel scanning type solid-state image sensor of the present invention, phase-shifted read pulses are applied respectively to plural kinds of read electrodes in each of read gates corresponding to individual pixels, and the phase-shifted read pulses are applied respectively to a plurality of pixel groups, thereby lowering the read voltage to eventually curtail the power consumption. And thus, it becomes possible to realize low-power driving in the solid-state image sensor having down-sized pixels.

Although the present invention has been described hereinabove with reference to some preferred embodiments thereof, it is to be understood that the invention is not limited to such embodiments alone, and a variety of other changes and modifications will be apparent to those skilled in the art without departing from the spirit of the invention.

The scope of the invention, therefore, is to be determined solely by the appended claims.

What is claimed is:

1. A progressive scanning type solid-state image sensor for reading all pixels sequentially, comprising:
   pixels arrayed in a matrix;
   vertical transfer registers corresponding respectively to individual columns of said pixels;
   read gates formed corresponding to the individual pixels for reading out signal charges from said pixels to said vertical transfer registers;

plural types of read gate electrodes corresponding to each of a plurality of the pixels;

a means for applying phase-shifted read pulses respectively to the plural types of read gate electrodes-wherein the assertion of said phase-shifted read pulses overlap each other; and wherein two different gate electrodes of a first pixel each receive a first pixel read signal that is substantially the same in both magnitude and duration and two different gate electrodes of an adjacent second pixel in an adjacent row each receive a second pixel read signal that is substantially the same in both magnitude and duration as the first read pixel, the second read pixel being offset from the first read pixel such that it only partially overlaps the first pixel read signal.

2. A progressive scanning type solid-state image sensor for reading all pixels sequentially, comprising:

pixels arrayed in a matrix;

vertical transfer registers corresponding respectively to individual columns of said pixels;

read gates formed corresponding to the individual pixels for reading out signal charges from said pixels to said vertical transfer registers;

plural types of read gate electrodes corresponding to each of a plurality of the pixels;

a means for applying phase-shifted read pulses respectively to the read gates for a plurality of pixel groups wherein said phase-shifted read pulses overlap each other; and wherein a first group of two different gate electrodes respectively corresponding to adjacent pixels receives a first pixel read signal that is substantially the same in both magnitude and duration and a second group of two different gate electrodes respectively corresponding to the adjacent pixels receives a second pixel read signal that is offset from the first read pixel signal such that it only partially overlaps the first pixel read signal.

3. A method of driving a progressive scanning type solid-state image sensor to read all pixels sequentially by applying phase-shifted read pulses to plural kinds of read gate electrodes in read gates which are formed corresponding to the individual pixels and which are disposed between the arrayed pixels and charge transfer registers provided corresponding to the individual columns of said pixels wherein said phase-shifted read pulses overlap each other; and wherein two different gate electrodes of a first pixel each receive a first pixel read signal that is substantially the same in both magnitude and duration and two different gate electrodes of an adjacent second pixel in an adjacent row each receive a second pixel read signal that is substantially the same in both magnitude and duration as the first read pixel, the second read pixel being offset from the first read pixel such that it only partially overlaps the first pixel read signal.

4. A method of driving a progressive scanning type solid-state image sensor to read all pixels sequentially by dividing the arrayed pixels into a plurality of groups, and applying phase-shifted read pulses to the individual groups of said pixels wherein said phase-shifted read pulses overlap each other; and wherein a first group of two different gate electrodes respectively corresponding to adjacent pixels receives a first pixel read signal that is substantially the same in both magnitude and duration and a second group of two different gate electrodes respectively corresponding to the adjacent pixels receives a second pixel read signal that is offset from the first read pixel signal such that it only partially overlaps the first pixel read signal.

5. The method of driving the progressive scanning type solid-state image sensor according to claim 4, wherein plural kinds of read gate electrodes are formed corresponding respectively to the individual pixels, and phase-shifted read pulses are applied respectively to said read gate electrodes.

6. The progressive scanning type solid-state image sensor according to claim 1, wherein each of said read pulses applied to read gate electrodes are phase-shifted.

7. The method of driving a progressive scanning type solid-state image sensor according to claim 3, wherein each of said read pulses applied to read gate electrodes are phase-shifted.

8. The progressive scanning type solid-state image sensor according to claim 1, wherein each of said read pulses applied to read gate electrodes associated with one pixel are phase-shifted from each of said read pulses applied to read gate electrodes associated with another pixel which is vertically adjacent to said one pixel.

9. The method of driving a progressive scanning type solid-state image sensor according to claim 3, wherein each of said read pulses applied to read gate electrodes associated with one pixel are phase-shifted from each of said read pulses applied to read gate electrodes associated with another pixel which is vertically adjacent to said one pixel.

10. A progressive scanning type solid-state image sensor for reading all pixels sequentially, comprising:

pixels arrayed in a matrix;

vertical transfer registers corresponding respectively to individual columns of said pixels;

read gates formed corresponding to the individual pixels for reading out signal charges from said pixels to said vertical transfer registers;

plural types of read gate electrodes corresponding to each of a plurality of the pixels;

a means for applying phase-shifted read pulses respectively to the read gates for a plurality of pixel groups wherein said phase-shifted read pulses overlap each other wherein a first gate electrode of a first pixel receives a first pixel read signal of a first magnitude and first duration and a second gate electrode of the first pixel receives a second pixel read signal, the second pixel read signal being offset from the first pixel read signal such that it only partially overlaps the first pixel read signal, a first gate electrode of a second pixel in an adjacent row receives a first pixel read signal of the first magnitude and first duration and a second gate electrode of the second pixel receives a second pixel read signal, the second pixel read signal being offset from the first pixel read signal such that it only partially overlaps the first pixel read signal.

11. A method of driving a progressive scanning type solid-state image sensor to read all pixels sequentially by dividing the arrayed pixels into a plurality of groups, and applying phase-shifted read pulses to the individual groups of said pixels wherein said phase-shifted read pulses overlap each other, and wherein a first gate electrode of a first pixel receives a first pixel read signal of a first magnitude and first duration and a second gate electrode of the first pixel receives a second pixel read signal, the second pixel read signal being offset from the first pixel read signal such that it only partially overlaps the first pixel read signal, a first gate electrode of a second pixel in an adjacent row receives a first pixel read signal of the first magnitude and first duration and a second gate electrode of the second pixel receives a second pixel read signal, the second pixel read signal being offset from the first pixel read signal such that it only partially overlaps the first pixel read signal.

* * * * *